United States Patent [19]
Maekawa et al.

[11] Patent Number: 5,775,000
[45] Date of Patent: Jul. 7, 1998

[54] SUBSTRATE GRIPPER DEVICE FOR SPIN DRYING

[75] Inventors: Toshiro Maekawa, Sagamihara; Ryuji Haraguchi, Fujisawa, both of Japan

[73] Assignee: Ebara Corporation, Tokyo, Japan

[21] Appl. No.: 855,361

[22] Filed: May 13, 1997

[30] Foreign Application Priority Data

May 13, 1996 [JP] Japan .................... 8-142281

[51] Int. Cl.$^6$ .................................... F26B 17/24
[52] U.S. Cl. ................................ 34/58; 134/902
[58] Field of Search ................... 34/312, 313, 317, 34/58; 134/62, 902; 414/744.8, 757, 783, 936

[56] References Cited

U.S. PATENT DOCUMENTS

| | | | |
|---|---|---|---|
| 4,651,440 | 3/1987 | Karl | 34/58 |
| 4,724,619 | 2/1988 | Poli et al. | 34/58 |
| 5,174,045 | 12/1992 | Thompson et al. | 34/58 |
| 5,566,466 | 10/1996 | Hearne | 34/58 |
| 5,715,610 | 2/1998 | Smith, Jr. et al. | 34/58 |

FOREIGN PATENT DOCUMENTS

| | | |
|---|---|---|
| 62-60027 | 4/1987 | Japan . |
| 3-9607 | 2/1991 | Japan . |

*Primary Examiner*—Henry A. Bennett
*Assistant Examiner*—Steven Gravini
*Attorney, Agent, or Firm*—Wenderoth, Lind & Ponack, L.L.P.

[57] ABSTRACT

A substrate gripper device for gripping a substrate has a rotatable substrate stage, a plurality of fixing fingers vertically mounted on an outer edge of the rotatable substrate stage and having respective horizontal substrate rests for placing thereon an outer edge of the substrate, and a plurality of swing fingers angularly movably supported on the fixing fingers, respectively, for vertically gripping the substrate in coaction with the fixing fingers. The swing fingers are normally biased to move in a closing direction toward the fixing fingers, respectively, by helical springs acting on the swing fingers. A plurality of opening pins are vertically movably disposed below the swing fingers, respectively, and movable upwardly for angularly moving the swing fingers in the opening direction against biasing forces of the helical springs. An opening mechanism is vertically movably disposed below the substrate stage for simultaneously moving the opening pins upwardly.

5 Claims, 5 Drawing Sheets

SUBSTRATE GRIPPER DEVICE FOR SPIN DRYING

BACKGROUND OF THE INVENTION

1. Field of the Invention

The present invention relates to a substrate gripper device for gripping a substrate such as a semiconductor substrate, a glass substrate, a liquid-crystal panel, or the like which needs to be highly clean while the substrate is being cleaned or spin-dried.

2. Description of the Prior Art

As semiconductor devices become more highly integrated in recent years, line-widths of circuit interconnections become thinner and the distances between those interconnections also become smaller. While in various fabrication processes, fine semiconductor particles, dust particles, and peeled-off pieces such as crystalline bodies tend to be attached to semiconductor substrates. If foreign matter particles which is greater than the distance between interconnections existed on a semiconductor substrate, then a short circuit would be caused between the interconnections. Therefore, all foreign matter particles on semiconductor substrates have to be removed to avoid undesirable short circuits.

Such unwanted foreign matter particles also have to be removed from substrates with fine patterns thereon including glass substrates for use as masks and liquid-crystal panels during fabrication processes thereof. To meet the above requirements, there has been desired a cleaning technique for washing away fine foreign matter particles of submicron sizes from substrates such as semiconductor substrates.

While those substrates are being cleaned or subsequently spin-dried, they have to be reliably gripped by a substrate gripper device.

It has been widely practiced to rotate a substrate at high speeds ranging from 2000 to 3000 rpm while it is being gripped by a substrate gripper device for cleaning or spin-drying the substrate.

One conventional substrate gripper device is shown in FIG. 1 of the accompanying drawings. As shown in FIG. 1, a plurality of support pins 2 are vertically mounted on a peripheral edge of a disk-shaped turntable (substrate stage) 1 which is rotatable at high speeds, and a substantially circular semiconductor substrate S is placed on and held by respective shoulders 3 of the support pins 2. The substrate gripper device is disclosed in Japanese laid-open patent publication No. 4-53684, for example.

One problem with this substrate gripper device is that when the turntable 1 with the semiconductor substrate S supported thereon rotates at high speeds, the semiconductor substrate S is liable to lift off from the support pins 2, and the substrate gripper device is incapable of reliably preventing the semiconductor substrate S from being lifted off from the support pins 2.

FIG. 2 shows another known substrate gripper device disclosed in Japanese laid-open patent publication No. 3-30426, for example. As shown in FIG. 1, a circumferential edge of a semiconductor substrate S is gripped in place between upper surfaces of plural arms 4 extending radially outwardly and presser fingers 6 that are normally urged downwardly by respective springs 5. For releasing the semiconductor substrate S, the substrate gripper device needs a mechanism for turning the pressing fingers 6 in an opening direction or lifting the pressing fingers 6 off the semiconductor substrate S. Since such a mechanism has to rotate with the semiconductor substrate S, it is considerably complex in structure. The entire assembly that rotates is relatively heavy, and cannot rotate at speeds beyond a certain speed limit.

SUMMARY OF THE INVENTION

It is therefore an object of the present invention to provide a substrate gripper device which is relatively simple in structure, is capable of reliably gripping a substrate at its circumferential edge, can be handled with ease, and has a mechanism for opening and closing substrate grippers which is separate from a rotatable assembly, thereby minimizing the weight of the rotatable assembly and allowing the rotatable assembly to rotate at high speeds.

To achieve the above object, there is provided in accordance with the present invention a substrate gripper device for gripping a substrate, comprising a rotatable substrate stage, a plurality of fixing fingers mounted on an outer edge of the rotatable substrate stage and having respective substrate rests for placing thereon an outer edge of the substrate, a plurality of swing fingers angularly movably supported on the fixing fingers, respectively, for gripping the substrate in coaction with the fixing fingers, biasing means for normally biasing the swing fingers to move in a closing direction toward the fixing fingers, a plurality of opening pins disposed below the swing fingers, and movable upwardly for angularly moving the swing fingers in the opening direction against biasing forces of the biasing means, and an opening mechanism disposed below the substrate stage for simultaneously moving the opening pins upwardly.

The biasing means may comprise a plurality of helical springs acting on the swing fingers, respectively.

The opening mechanism may comprise a vertically movable cylindrical sleeve and an annular member fixed to an upper end of the vertically movable cylindrical sleeve, the annular member having an upwardly facing annular surface engageable with lower ends of the opening pins.

The substrate stage may be controlled to stop rotating in order to bring the opening pins above the opening mechanism.

With the above arrangement, the outer edge of the substrate is sandwiched between the fixing fingers and the swing fingers and firmly gripped therebetween under the bias of the biasing means. The opening mechanism, which is separate from the substrate stage, is moved upwardly to simultaneously lift all the opening pins for thereby releasing the substrate. The substrate gripper device is relatively simple in structure, and allows the substrate to rotate at high speeds as the rotatable assembly thereof, including the substrate stage, which is relatively small in weight.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
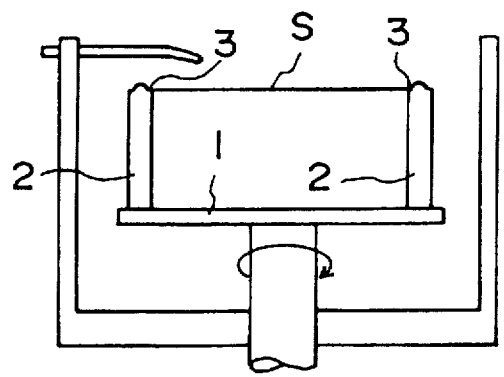
FIG. 1 is a schematic front elevational view of a conventional substrate gripper device.
Figure 2:
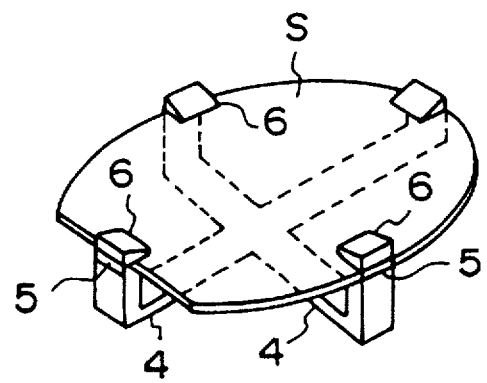
FIG. 2 is a schematic perspective view of another conventional substrate gripper device.
Figure 3:
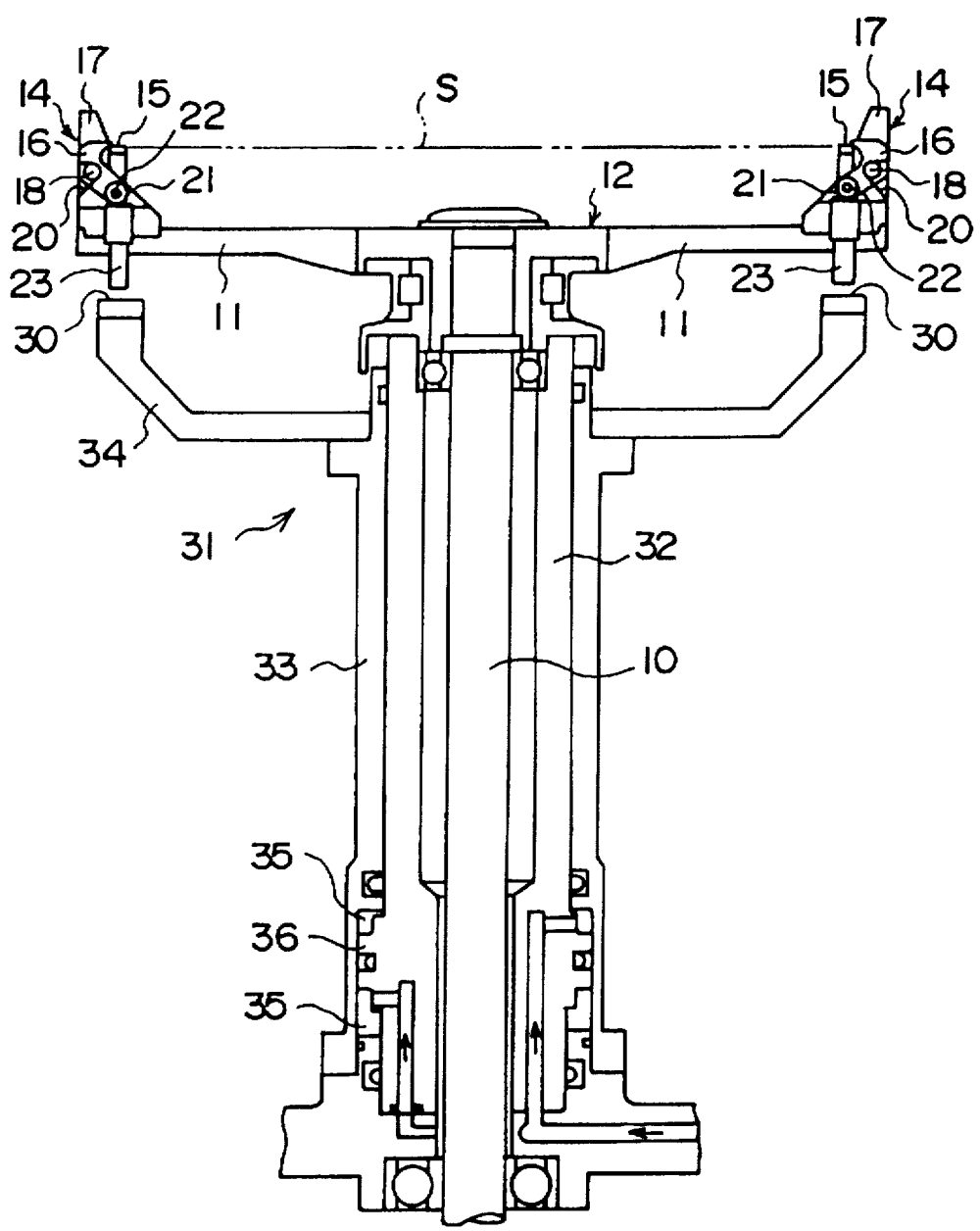
FIG. 3 is a vertical cross-sectional view of a substrate gripper device according to a first embodiment of the present invention.
Figure 4:
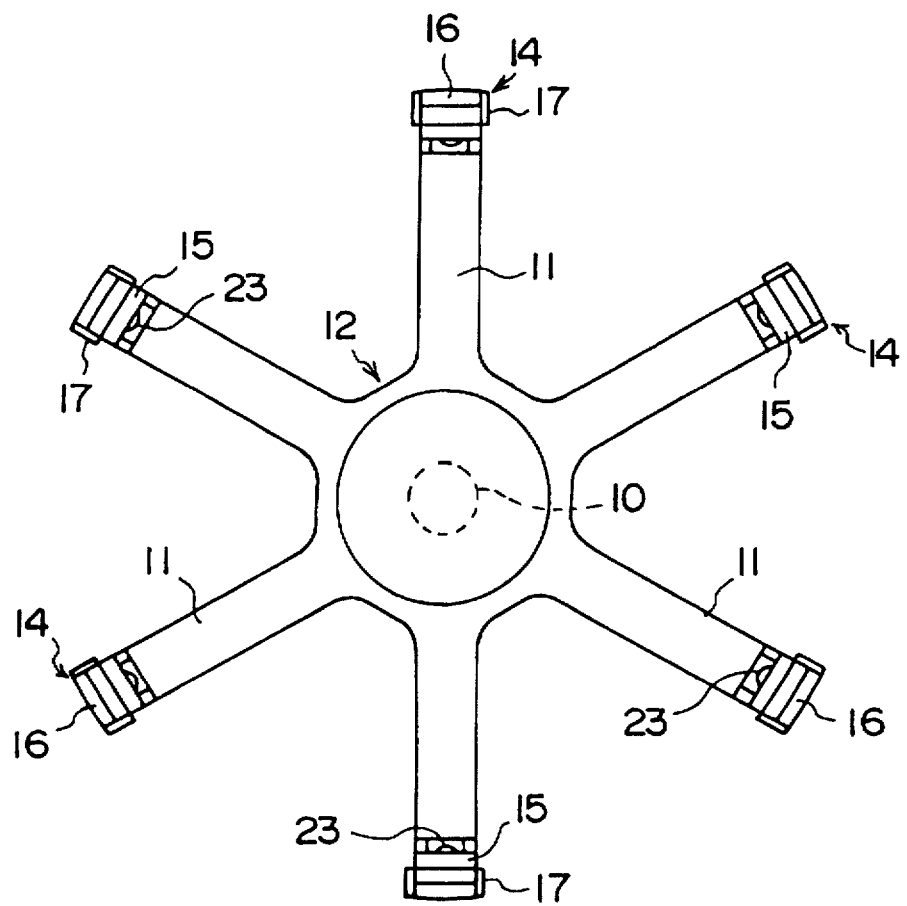
FIG. 4 is a plan view of the substrate gripper device shown in FIG. 3.

As shown in FIGS. 3 and 4, a substrate gripper device according to a first embodiment of the present invention has a vertical rotatable shaft 10 rotatable at high speeds and a substrate stage 12 fixedly mounted on an upper end of the shaft 10 and having a plurality of (six in the illustrated embodiment) arms 11 extending radially outwardly in the horizontal direction. The arms 11 have the same length as each other and are angularly spaced at equal angles. Upwardly projecting fixing fingers 14 are fastened to respective radially outer ends of the arms 11 by bolts 13.

Each of the fixing fingers 14 includes a substrate rest 15 having a horizontal surface for placing a semiconductor substrate S horizontally thereon. When the semiconductor substrate S drops horizontally from above the fixing fingers 14, an outer circumferential edge of the semiconductor substrate S is positioned on the substrate rests 15 of the fixing fingers 14. Each of the fixing fingers 14 also includes a swing finger 16 angularly movably supported on a horizontal support shaft 18 for gripping the semiconductor substrate S in coaction with the substrate rest 15.

Figure 5:
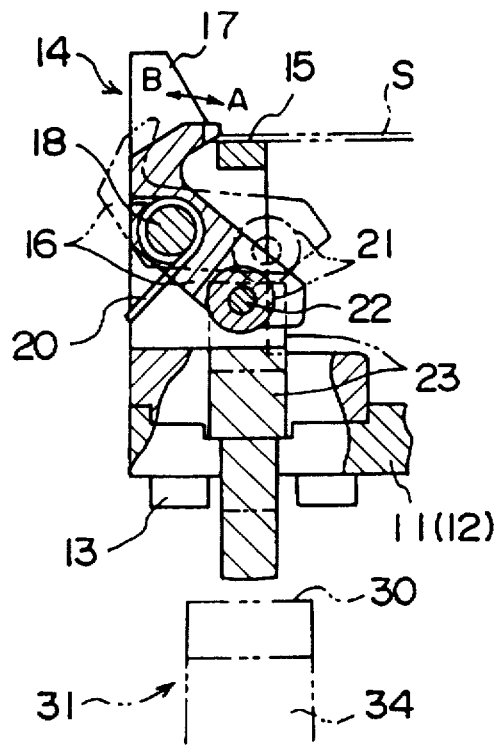
FIG. 5 is an enlarged fragmentary vertical cross-sectional view of the substrate gripper device shown in FIG. 3.
Figure 6:
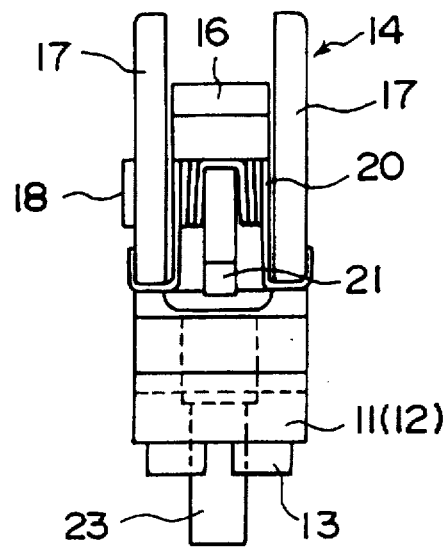
FIG. 6 is a side elevational view of the substrate gripper device shown in FIG. 5.
Figure 7:
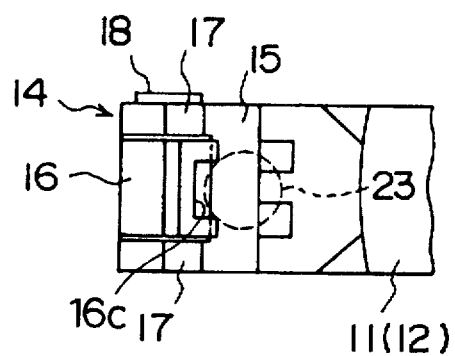
FIG. 7 is a plan view of the substrate gripper device shown in FIG. 5.

As shown in FIGS. 5 through 7, each of the fixing fingers 14 comprises a pair of laterally spaced side plates 17 with the support shaft 18 extending horizontally between and connected to the side plates 17. The support shaft 18 extends horizontally through the swing finger 16.

A helical torsion spring 20 is disposed around the support shaft 18 and acts between the swing finger 16 and the side plates 17 for normally biasing the swing finger 16 to turn the swing finger 16 in a closing direction, i.e., in the direction indicated by the arrow A in FIG. 5, toward the substrate rest 15. When the outer circumferential edge of the semiconductor substrate S is sandwiched between the substrate rest 15 and the swing finger 16, the swing finger 16 resiliently grips the semiconductor substrate S against the substrate rest 15 under the resilient forces of the helical torsion spring 20. A front end of the swing finger 16 for gripping the substrate S, has cut-out portion 16C.

Specifically, the helical torsion spring 20 has opposite ends held in engagement with the side plates 17 at a position below the support shaft 18 and opposite side portions leading to the opposite ends thereof and wound around the support shaft 18. The helical torsion spring 20 has a central portion pressed against a rear surface of the swing finger 16 above the support shaft 18 for normally pressing the swing finger 16 to turn about the support shaft 18 toward the substrate rest 15.

The helical torsion spring 20 is made of stainless steel or a springy material coated with fluoroplastics or a resin coating for resistance against erosion due to contact with chemicals.

Each of the swing fingers 16 has a lower end positioned radially inwardly of the support shaft 18 with respect to the substrate stage 12 and divided into two horizontally spaced legs between which there is rotatably supported a roller 21 by a pivot shaft 22. A vertical cylindrical opening pin 23 is vertically movably supported on each of the fixing fingers 14 below the roller 21. The opening pin 23 has a lower portion extending downwardly from the arm 11.

When the opening pin 23 is lifted, its upper surface engages the roller 21. Upon continued ascending movement of the opening 23, it lifts the lower end of the swing finger 16 while rotating the roller 21, causing the swing finger 16 to turn in an opening direction, i.e., in the direction indicated by the arrow B in FIG. 5, away from the substrate rest 15 against the bias of the helical spring 20. When the opening pin 23 is not lifted, it is lowered under its own weight and the bias of the helical spring 20.

When the substrate stage 12 rotates about the shaft 10, the opening pins 23 also rotate along a circular path about the shaft 10. As shown in FIG. 3, an opening mechanism 31 is vertically movably disposed below the substrate stage 12 and has an upwardly facing annular surface 30 disposed beneath the opening pins 23 and extending fully along the circular path along which the opening pins 23 are rotatable.

The opening mechanism 31 comprises a cylindrical sleeve 33 disposed around an inner sleeve 32 which surrounds the shaft 10, and an annular cup 34 fixed to the upper end of the cylindrical sleeve 33 and having the upwardly facing annular surface 30.

A cylinder chamber 35 is defined between an inner circumferential surface of the cylindrical sleeve 33 and an outer circumferential surface of the inner sleeve 32 in a lower region thereof. The inner sleeve 32 has a larger-diameter piston 36 slidably disposed in the cylinder chamber 35. When a working fluid such as air is introduced into the cylinder chamber 35, the cylindrical sleeve 33 is vertically moved with respect to the inner sleeve 32 for thereby vertically moving the annular cup 34 with respect to the substrate stage 12.

Specifically, when the working fluid is introduced into an upper portion of the cylinder chamber 35 above the piston 36, the cylindrical sleeve 33 is elevated with respect to the inner sleeve 32, and when the working fluid is introduced into a lower portion of the cylinder chamber 35 below the piston 36, the cylindrical sleeve 33 is lowered with respect to the inner sleeve 32.

When the cylindrical sleeve 33 is elevated, the annular cup 34 is also elevated therewith, causing the upwardly facing annular surface 30 to engage the lower ends of the opening pins 23 and lift the opening pins 23 simultaneously against their own weight and the bias of the helical springs 20. When the cylindrical sleeve 33 is lowered, the annular cup 34 is also lowered therewith, disengaging the upwardly facing annular surface 30 from the lower ends of the opening pins 23, which are lowered simultaneously under their own weight and the bias of the helical springs 20.

As described above, the opening pins 23 can be lifted to open the swing fingers 16 away from the substrate rests 15 by the opening mechanism 31 which is separate from the substrate stage 12 and which is not rotatable with the substrate stage 12. Consequently, the rotatable assembly of the substrate gripper device is relatively small in weight. For example, the substrate stage 12 can be rotated at high speeds ranging from 3000 to 4000 rpm.

The opening mechanism 31 may comprise a plurality of vertical cylinder units having respective piston rods, and the annular cup 34 with the upwardly facing annular surface 30 may be coupled to the upper ends of the piston rods, so that the annular cup 34 may be lifted when the vertical cylinder units are simultaneously actuated to project their respective piston rods.

Operation of the substrate gripper device shown in FIGS. 3 through 7 will be described below.

For gripping a semiconductor substrate S to be cleaned or spin-dried, the working fluid is introduced into the upper portion of the cylinder chamber 35 above the piston 36, elevating the cylindrical sleeve 33 with respect to the inner sleeve 32.

The annular cup 34 is also elevated with the cylindrical sleeve 33, causing the upwardly facing annular surface 30 to lift the opening pins 23 simultaneously. The swing fingers 16 are angularly moved in the opening direction indicated by the arrow B in FIG. 5 away from the substrate rests 15 against the bias of the helical springs 20.

Then, when the semiconductor substrate S drops from above the fixing fingers 14 onto the substrate rests 15, the outer circumferential edge of the semiconductor substrate S is placed on the upper surfaces of the substrate rests 15. Thereafter, the working fluid is introduced into the lower portion of the cylinder chamber 35 below the piston 36, lowering the cylindrical sleeve 33 with respect to the inner sleeve 32.

The annular cup 34 is also lowered with the cylindrical sleeve 33, disengaging the upwardly facing annular surface 30 from the lower ends of the opening pins 23, which are lowered simultaneously under their own weight and the bias of the helical springs 20. The swing fingers 16 are now turned in the closing direction indicated by the arrow A in FIG. 5 toward the substrate rests 15 under the bias of the helical springs 20, as indicated by the solid lines.

Thereafter, the shaft 10 is rotated about its own axis at a high speed to cause the substrate stage 12 and the semiconductor substrate S held thereon to rotate at the high speed. At this time, the semiconductor substrate S has its outer circumferential edge firmly gripped between the substrate rests 15 and the swing fingers 16 under the bias of the helical springs 20. Consequently, the semiconductor substrate S is prevented from being lifted off the substrate stage 12 under external forces. Because the rotatable assembly of the substrate gripper device is relatively small, it can rotate the semiconductor substrate S at relatively high speeds.

After the semiconductor substrate S is cleaned or spin-dried, the shaft 10 is stopped, and the cylindrical sleeve 33 is lifted to open the swing fingers 16 in the direction indicated by the arrow B in FIG. 5 for thereby releasing the semiconductor substrate S as indicated by the two-dot-and-dash lines. The semiconductor substrate S is now removed upwardly from the fixing fingers 14. Since the swing finger 16 has a cutout portion at the front end thereof, the cleaning solvent is not pooled therein, then the cut-out portion prevents occurrence of water-mark on the substrate after spin-dried.

In the above embodiment, the opening mechanism 31 has the annular cup 34. However, the opening mechanism 31 may have a plurality of radial arms mounted on the upper end of the cylindrical sleeve 33 and having respective radially outer ends for engagement with the opening pins 23. According to this modification, it is necessary to control the substrate stage 12 to stop its rotation in order to align the opening pins 23 with the respective radially outer ends of the radial arms. The substrate stage 12 can be controlled to stop its rotation as described above if the shaft 10 is rotated by an AC servomotor whose angular position prior to rotation and rotational speed are stored for controlling itself to bring the opening pins 23 into alignment with the respective radially outer ends of the radial arms.

Figure 8:
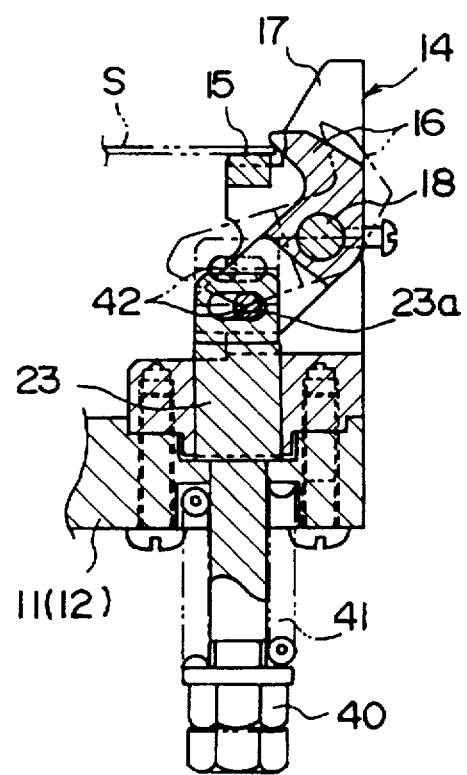
FIG. 8 is an enlarged fragmentary vertical cross-sectional view of a substrate gripper device according to a second embodiment of the present invention.

FIG. 8 shows a substrate gripper device according to a second embodiment of the present invention. Those parts of the substrate gripper device shown in FIG. 8 are denoted by identical reference numerals and representations for identical portions to the substrate gripper device shown in FIG. 5 and will not be described in detail below.

As shown in FIG. 8, the swing finger 16 is normally urged to turn in the closing direction by a helical spring 41 disposed between the arm 11 and a bolt 40 for urging the lower end of the opening pin 23 downwardly. The upper end of the opening pin 23 is operatively coupled to the swing finger 16 by a coupling pin 42. The swing finger 16 has a horizontal slot 23a defined therein, and the coupling pin 42 is movably inserted in the horizontal slot 23a and joined to the upper end of the opening pin 23.

The opening pin 23 is normally biased to move downwardly under the bias of the helical spring 41, causing the coupling pin 42 to turn in a direction to close the swing finger 16 toward the substrate rest 15 as indicated by the solid lines in FIG. 8, for thereby gripping the outer circumferential edge of the semiconductor substrate S. When the opening pin 23 is lifted against the resilient forces of the helical spring 41, the coupling pin 42 is angularly moved to open the swing finger 16 away from the substrate rest 15 as indicated by the two-dot-and-dash lines in FIG. 8, for thereby releasing the outer circumferential edge of the semiconductor substrate S.

In the above embodiments, the substantially circular semiconductor substrate has been illustrated as the substrate which is gripped by the substrate gripper device. However, the substrate gripper device according to the present invention may be used to grip substrates of other shapes such as a rectangular shape.

Although certain preferred embodiments of the present invention have been shown and described in detail, it should be understood that various changes and modifications may be made therein without departing from the scope of the appended claims.

What is claimed is:

1. A substrate gripper device for gripping a substrate, comprising:

a rotatable substrate stage;

a plurality of fixing fingers mounted on an outer edge of said rotatable substrate stage and having respective substrate rests for placing thereon an outer edge of the substrate;

a plurality of swing fingers angularly movably supported on said fixing fingers, respectively, for gripping the substrate in coaction with said fixing fingers;

biasing means for normally biasing said swing fingers to move in a closing direction toward said fixing fingers;

a plurality of opening pins disposed below said swing fingers, and movable upwardly for angularly moving said swing fingers in an opening direction against biasing forces of said biasing means; and an opening mechanism disposed below said substrate stage for simultaneously moving said opening pins upwardly.

2. A substrate gripper device according to claim 1, wherein said biasing means comprises a plurality of helical springs acting on said swing fingers, respectively.

3. A substrate gripper device according to claim 1, wherein said swing finger has a cut-out portion at the front end thereof.

4. A substrate gripper device according to claim 1, wherein said opening mechanism comprises a vertically movable cylindrical sleeve and an annular member fixed to an upper end of said vertically movable cylindrical sleeve, said annular member having an upwardly facing annular surface engageable with lower ends of said opening pins.

5. A substrate gripper device according to claim 1, wherein said substrate stage is controlled to stop rotating in order to bring said opening pins above said opening mechanism.

* * * * *